(12) United States Patent
Aekins et al.

(10) Patent No.: US 6,729,899 B2
(45) Date of Patent: May 4, 2004

(54) BALANCE HIGH DENSITY 110 IDC TERMINAL BLOCK

(75) Inventors: Robert A. Aekins, Branford, CT (US); Mark E. Martich, Barrington, RI (US); Samuel E. Watrous, Ledyard, CT (US); Joseph E. Dupuis, Ledyard, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 10/052,593

(22) Filed: Jan. 18, 2002

(65) Prior Publication Data

US 2003/0102873 A1 Jun. 5, 2003

Related U.S. Application Data

(60) Provisional application No. 60/288,156, filed on May 2, 2001.

(51) Int. Cl.[7] .................................................. H01R 4/24
(52) U.S. Cl. .................................... 439/404; 439/941
(58) Field of Search ............................... 439/404, 401, 439/402, 941

(56) References Cited

U.S. PATENT DOCUMENTS

| | | | | |
|---|---|---|---|---|
| 5,295,869 A | * | 3/1994 | Siemon et al. | 439/620 |
| 5,326,284 A | * | 7/1994 | Bohbot et al. | 439/676 |
| 5,435,752 A | * | 7/1995 | Siemon et al. | 439/620 |
| 5,459,643 A | * | 10/1995 | Siemon et al. | 361/785 |
| 6,023,200 A | * | 2/2000 | Rhee | 333/1 |
| 6,050,843 A | * | 4/2000 | Adriaenssens et al. | 439/404 |
| 6,057,743 A | * | 5/2000 | Aekins | 333/1 |
| 6,089,923 A | * | 7/2000 | Phommachanh | 439/676 |
| 6,346,005 B1 | | 2/2002 | Viklund et al. | 439/404 |
| 6,379,174 B1 | | 4/2002 | Siemon et al. | 439/404 |
| 6,533,618 B1 | * | 3/2003 | Aekins | 439/676 |

FOREIGN PATENT DOCUMENTS

EP      0 854 664     *   7/1998

* cited by examiner

Primary Examiner—Tulsidas C. Patel
(74) Attorney, Agent, or Firm—McCarter & English, LLP

(57) ABSTRACT

The present disclosure is related to an insulation displacement contact ("IDC") device that transfers electrical contact between two telecommunication cables to complete a media connection. The IDC includes a printed circuit board ("PCB") which utilizes the positional relationship of a plurality of conductors in communication with the two telecommunication cables to form a capacitance, such that the Near-end Crosstalk (NEXT) and Far End Crosstalk (FEXT) are reduced without compromising impedance.

44 Claims, 6 Drawing Sheets

BALANCE HIGH DENSITY 110 IDC TERMINAL BLOCK

CROSS-REFERENCE TO RELATED APPLICATION(S)

The subject application claims the benefit of U.S. Provisional Application Ser. No. 60/288,156 filed May 2, 2001, the disclosure of which is herein incorporated by reference.

BACKGROUND OF THE DISCLOSURE

1. Technical Field

The present disclosure relates to devices for interfacing with high frequency data transfer media and, more particularly, to insulation displacement contact ("IDC") devices, such as those that are used as interface connectors for Unshielded Twisted Pair ("UTP") media, that advantageously compensate for and reduce electrical noise.

2. Background Art

In data transmission, the signal originally transmitted through the data transfer media is not necessarily the signal received. The received signal will consist of the original signal after being modified by various distortions and additional unwanted signals that affect the original signal between transmission and reception. These distortions and unwanted signals are commonly collectively referred to as "electrical noise," or simply "noise." Noise is a primary limiting factor in the performance of a communication system. Many problems may arise from the existence of noise in connection with data transmissions, such as data errors, system malfunctions and/or loss of the intended signals.

The transmission of data, by itself, generally causes unwanted noise. Such internally generated noise arises from electromagnetic energy that is induced by the electrical energy in the individual signal-carrying lines within the data transfer media and/or data transfer connecting devices, such electromagnetic energy radiating onto or toward adjacent lines in the same media or device. This cross coupling of electromagnetic energy (i.e., electromagnetic interference or EMI) from a "source" line to a "victim" line is generally referred to as "crosstalk."

Most data transfer media consist of multiple pairs of lines bundled together. Communication systems typically incorporate many such media and connectors for data transfer. Thus, there inherently exists an opportunity for significant crosstalk interference.

Crosstalk can be categorized in one of two forms. Near end crosstalk, commonly referred to as NEXT, arises from the effects of near field capacitive (electrostatic) and inductive (magnetic) coupling between source and victim electrical transmissions. NEXT increases the additive noise at the receiver and therefore degrades the signal to noise ratio (SNR). NEXT is generally the most significant form of crosstalk because the high-energy signal from an adjacent line can induce relatively significant crosstalk into the primary signal. The other form of crosstalk is far end crosstalk, or FEXT, which arises due to capacitive and inductive coupling between the source and victim electrical devices at the far end (or opposite end) of the transmission path. FEXT is typically less of an issue because the far end interfering signal is attenuated as it traverses the loop.

Characteristics and parameters associated with electromagnetic energy waves can be derived by Maxwell's wave equations. In unbounded free space, a sinusoidal disturbance propagates as a transverse electromagnetic wave. This means that the electric field vectors are perpendicular to the magnetic field vectors lying in a plane perpendicular to the direction of the wave. As a result, crosstalk generally gives rise to a waveform shaped differently than the individual waveform(s) originally transmitted.

Unshielded Twisted Pair cable or UTP is a popular and widely used type of data transfer media. UTP is a very flexible, low cost media, and can be used for either voice or data communications. In fact, UTP is rapidly becoming the defacto standard for Local Area Networks ("LANs") and other in-building voice and data communications applications. In a UTP, a pair of copper wires generally form the twisted pair. For example, a pair of copper wires with diameters of 0.4–0.8 mm may be twisted together and wrapped with a plastic coating to form a UTP. The twisting of the wires increases the noise immunity and reduces the bit error rate (BER) of the data transmission to some degree. Also, using two wires, rather than one, to carry each signal permits differential signaling to be used. Differential signaling is generally more immune to the effects of external electrical noise.

The non-use of cable shielding (e.g., a foil or braided metallic covering) in fabricating UTP generally increases the effects of outside interference, but also results in reduced cost, size, and installation time of the cable and associated connectors. Additionally, non-use of cable shielding in UTP fabrication generally eliminates the possibility of ground loops (i.e., current flowing in the shield because of the ground voltage at each end of the cable not being exactly the same). Ground loops may give rise to a current that induces interference within the cable, interference against which the shield was intended to protect.

The wide acceptance and use of UTP for data and voice transmission is primarily due to the large installed base, low cost and ease of new installation. Another important feature of UTP is that it can be used for varied applications, such as for Ethernet, Token Ring, FDDI, ATM, EIA-232, ISDN, analog telephone (POTS), and other types of communication. This flexibility allows the same type of cable/system components (such as data jacks, plugs, cross-patch panels, and patch cables) to be used for an entire building, unlike shielded twisted pair media ("STP").

At present, UTP is being used for systems having increasingly higher data rates. Since demands on networks using UTP systems (e.g., 100 Mbit/s and 1200 Mbit/s transmission rates) have increased, it has become necessary to develop industry standards for higher system bandwidth performance. Systems and installations that began as simple analog telephone service and low speed network systems have now become high speed data systems. As the speeds have increased, so too has the noise.

The ANSI/TIA/EIA 568A standard defines electrical performance for systems that utilize the 1 to 100 MHz frequency bandwidth range. Exemplary data systems that utilize the 1–100 MHz frequency bandwidth range include IEEE Token Ring, Ethernet10Base-T and 100Base-T. EIA/TIA-568 and the subsequent TSB-36 standards define five categories, as shown in the following Table, for quantifying the quality of the cable (for example, only Categories 3, 4, and 5 are considered "datagrade UTP").

TABLE

| Category | Characteristic specified up to (MHz) | Various Uses |
|---|---|---|
| 1 | None | Alarm systems and other non-critical applications |
| 2 | None | Voice, EIA-232, and other low speed data |
| 3 | 16 | 10BASE-T Ethernet, 4-Mbits/s Token Ring, 100BASE-T4, 100VG-AnyLAN, basic rate ISDN. Generally the minimum standard for new installations. |
| 4 | 20 | 16-Mbits/s Token Ring. Not widely used. |
| 5 | 100 | TP-PMD, SONet, OC-3 (ATM), 100BASE-TX. The most popular for new data installations. |

Underwriter's Laboratory defines a level-based system, which has minor differences relative to the EIA/TIA-568's category system. For example, UL requires the characteristics to be measured at various temperatures. However, generally (for example), UL Level V (Roman numerals are used) is the same as EIA's Category 5, and cables are usually marked with both EIA and UL rating designations.

UTP cable standards are also specified in the EIA/TIA-568 Commercial Building Telecommunications Wiring Standard, including the electrical and physical requirements for UTP, STP, coaxial cables, and optical fiber cables. For UTP, the requirements currently include:

Four individually twisted pairs per cable

Each pair has a characteristic impedance of 100 Ohms+/−15% (when measured at frequencies of 1 to 16 MHz)

24 gauge (0.5106-mm-diameter) or optionally 22 gauge (0.6438 mm diameter) copper conductors are used Additionally, the EIA/TIA-568 standard specifies the color coding, cable diameter, and other electrical characteristics, such as the maximum cross-talk (i.e., how much a signal in one pair interferes with the signal in another pair—through capacitive, inductive, and other types of coupling). Since this functional property is measured as how many decibels (dB) quieter the induced signal is than the original interfering signal, larger numbers reflect better performance.

Category 5 cabling systems generally provide adequate NEXT margins to allow for the high NEXT associated with use of present UTP system components. Demands for higher frequencies, more bandwidth and improved systems (e.g., Ethernet 1000Base-T) on UTP cabling, render existing systems and methods unacceptable. The TIA/EIA category 6 draft addendum related to new category 6 cabling standards illustrates heightened performance demands. For frequency bandwidths of 1 to 250 MHz, the draft addendum requires the minimum NEXT values at 100 MHz to be −39.9 dB and −33.1 dB at 250 MHz for a channel link, and −54 dB at 100 MHz and −46 dB at 250 MHz for connecting hardware. Increasing the bandwidth for new category 6 (i.e., from 1 to 100 MHz in category 5 to 1 to 250 MHz in category 6) increases the need to review opportunities for further reducing system noise.

The standard IDC terminal block is configured and dimensioned so as to provide maximum compatibility and matability between various manufacturers, e.g., based on the standard for 110C connecting block mechanical dimensions. Two types of offsets have been produced from the standard 110C connecting block dimensions.

Type one is the standard 110C connecting block style for UTP cable splicing which is a straight through contact design and does not add any compensation methods to reduce crosstalk noises. The standard 110C connecting block provides a straightforward approach for 110C connecting block, by alignment of lead frames is in an uniformed parallel pattern high NEXT and FEXT is produced for certain wire pairs that are side by side. The standard 110C connecting block style is defined by two lead frame wire electrical connecting areas, section one is the matable area for input wire contact and section two is the output wire contact which completes the electrical signal connecting. This alignment of lead frames in an uniformed parallel pattern produces increases in NEXT and FEXT noises as well as increases in wire pair impedance.

Type two is the standard FCC part 68.500 style for modular plug housing which uses either pair separation or metal shielding methods to reduce crosstalk noises. Using either pair separation or metal shielding typically requires increasing the physical size from the IDC standard dimensions. Signal compensation is not needed by this approach since the wire pair separation of greater than 0.075 inches alone will decrease electrical NEXT noises by at least 9 dB. However, this method of reducing pair to pair NEXT does not re-balance the FEXT nor the impedance in the wires, since the pair capacitance has been offset by the IDC lead frames. If used, the metal shield is typically inserted between two wire pair lead frames to reduce the adjacent side of each wire pairs coupling to each other. These various methods provide a non-compensation approach for IDC terminal block NEXT reduction, but not without increasing IDC size and/or expensively re-bending extra metal coupling units to remove crosstalk noises.

Methods of compensation methods for connecting hardware crosstalk noise reduction and controlling are also addressed in U.S. Pat. No. 5,618,185 to Aekins, the subject matter of which is hereby incorporated herein by reference thereto.

In view of the increasing performance demands being placed on UTP systems, e.g., the implementation of category 6 standards, it would be beneficial to provide a device and/or methodology that reduces NEXT and FEXT noises associated with standard IDC terminal blocks in a simple and cost effective manner. These and other objectives are achieved through the advantageous insert devices and systems disclosed herein.

SUMMARY OF THE DISCLOSURE

The present disclosure provides a device that reduces the crosstalk NEXT and FEXT noises in IDC terminal blocks for a data/voice communication systems. A printed circuit board ("PCB") with the proper balance coupling is incorporated in the block to reduce noise and re-balance the signal without negatively impacting the impedance characteristics of the wire pairs in a simple and low cost manner. The electrical noise is reduced by the positional relationship of signals during passage through the PCB which advantageously results in signal feedback reactances that are used to compensate for pair to pair NEXT, FEXT and impedance.

In summary, the present disclosure is directed to providing a device for reducing electrical noise during the transfer of data signals between media having a plurality of electrically conductive signal carrying elements.

In one embodiment, the device includes a dielectric support member, a means for receiving and transmitting signals from the signal carrying elements and a means for using the signals themselves to produce a capacitance which reduces the electrical noise. In one aspect, the means for receiving and transmitting signals from the signal elements disposed on the support member is a plurality of electrically conductive ports in electrical communication with the signal elements. Additionally, the means for using the signals to produce a capacitance may take the form of a plurality of elongated electrically conductive members in a close positional relationship or pattern with respect to each other.

The present disclosure additionally embodies a device for reducing crosstalk noise in an insulation displacement contact connectable with media having a plurality of signal carrying elements with positive and negative polarity data signals. In one aspect, this embodiment includes a dielectric support member and a plurality of elongated electrically conductive members disposed on the support member. The conductive members are in electrical communication with the insulation displacement contact for receiving the data signals, and in a positional relationship with respect to each to produce a capacitance for reducing the crosstalk noise. Preferably, one or more elongated members are associated with only one signal carrying element. It is also preferable to have a greater amount of elongated members associated with signal carrying elements of like polarities to be in positional relationships which form a capacitance, rather than the elongated members associated with signal carrying elements of opposing polarities. The deliberate positioning of members of the same polarity to form a capacitance strengthens the respective signals in the members. Preferably, the elongated members are all substantially the same size and distance from each other.

In another embodiment, a system for reducing electrical noise during the transfer of data signals between media cables having signal carrying elements of negative and positive polarity is disclosed. The system includes an IDC in electrical communication with communication ports on a PCB. The ports are in turn in electrical communication with electrically conductive traces having portions in positional relationships with respect to each other for forming a capacitance to reduce electrical noise in the associated signals. Preferably, there are eight communication ports which corresponds with standard 4 pair (8 wires) UTP cables.

For purposes of further illustrating this particular embodiment, it is assumed that communication ports one through eight are in communication with wires one through eight in a standard UTP cable. Thus, the preferred arrangement is as follows: traces in communication with port three are in a positional relationship for forming a capacitance with traces in communication with port one and port five; traces in communication with port seven are in a positional relationship for forming a capacitance with traces in communication with port eight and port five; traces in communication with port six are in a positional relationship for forming a capacitance with traces in communication with port four and port eight; and traces in communication with port four are in a positional relationship for forming a capacitance with traces in communication with port one and port two.

Preferably, the arrangement of traces produce a balanced voltage bridge of mutual capacitor reactance to compensate for the electrical noise in the signals to the PCB.

These and other unique features of the systems, devices and methods of the present disclosure will become more readily apparent from the following description of the drawings taken in conjunction with the detailed description of preferred and exemplary embodiments.

BRIEF DESCRIPTION OF THE DRAWINGS

So that those having ordinary skill in the art to which the subject disclosure appertains will more readily understand how to construct and employ the subject disclosure, reference may be had to the drawings wherein.

Figure 1:
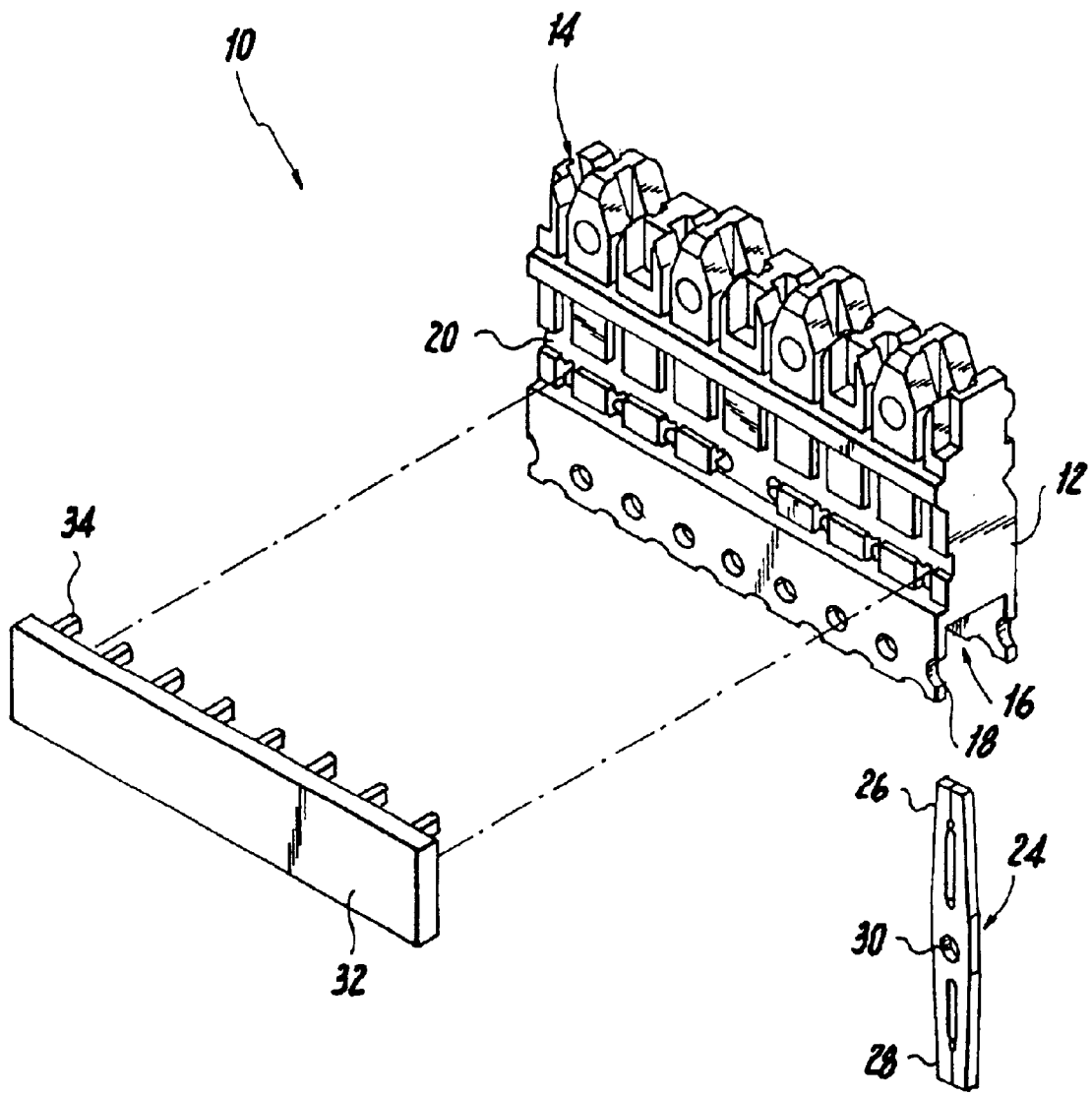
FIG. 1 is an exploded perspective view illustrating the arrangement of components in a standard 110 IDC terminal block.

These and other features of the method of the subject disclosure will become more readily apparent to those having ordinary skill in the art from the following detailed description of preferred and exemplary embodiments.

DETAILED DESCRIPTION OF PREFERRED EMBODIMENT(S)

The following detailed description of preferred and/or exemplary embodiments of the present disclosure is intended to be read in the light of, or in context with, the preceding summary and background descriptions. Unless otherwise apparent, or stated, directional references, such as "up", "down", "left", "right", "front" and "rear", are intended to be relative to the orientation of a particular embodiment of the disclosure as shown in the first numbered view of that embodiment. Also, a given reference numeral should be understood to indicate the same or a similar structure when it appears in different figures.

Exemplary devices in accordance with the present disclosure are directed to reducing the harmful effects of electrical noise which naturally occurs in signals during passage through data transfer cables and connecting components. In particular, the present disclosure involves incorporating signal compensating devices into a new or existing component, such as the high density 110 IDC terminal block.

Figure 2:
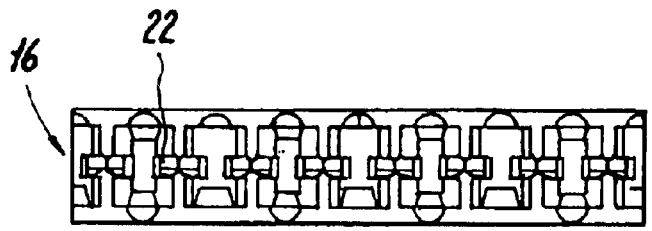
FIG. 2 is a top view of the standard IDC terminal block of FIG. 1.
Figure 3:
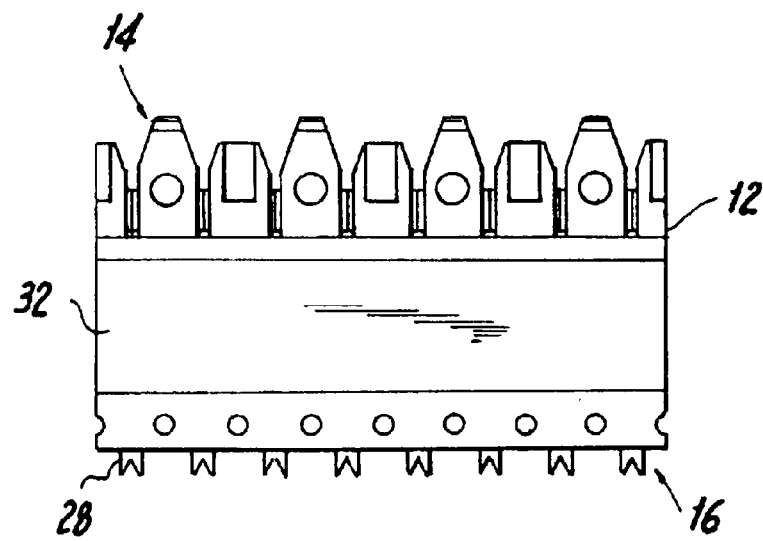
FIG. 3 is a front view of the standard IDC terminal block of FIG. 1.
Figure 11:
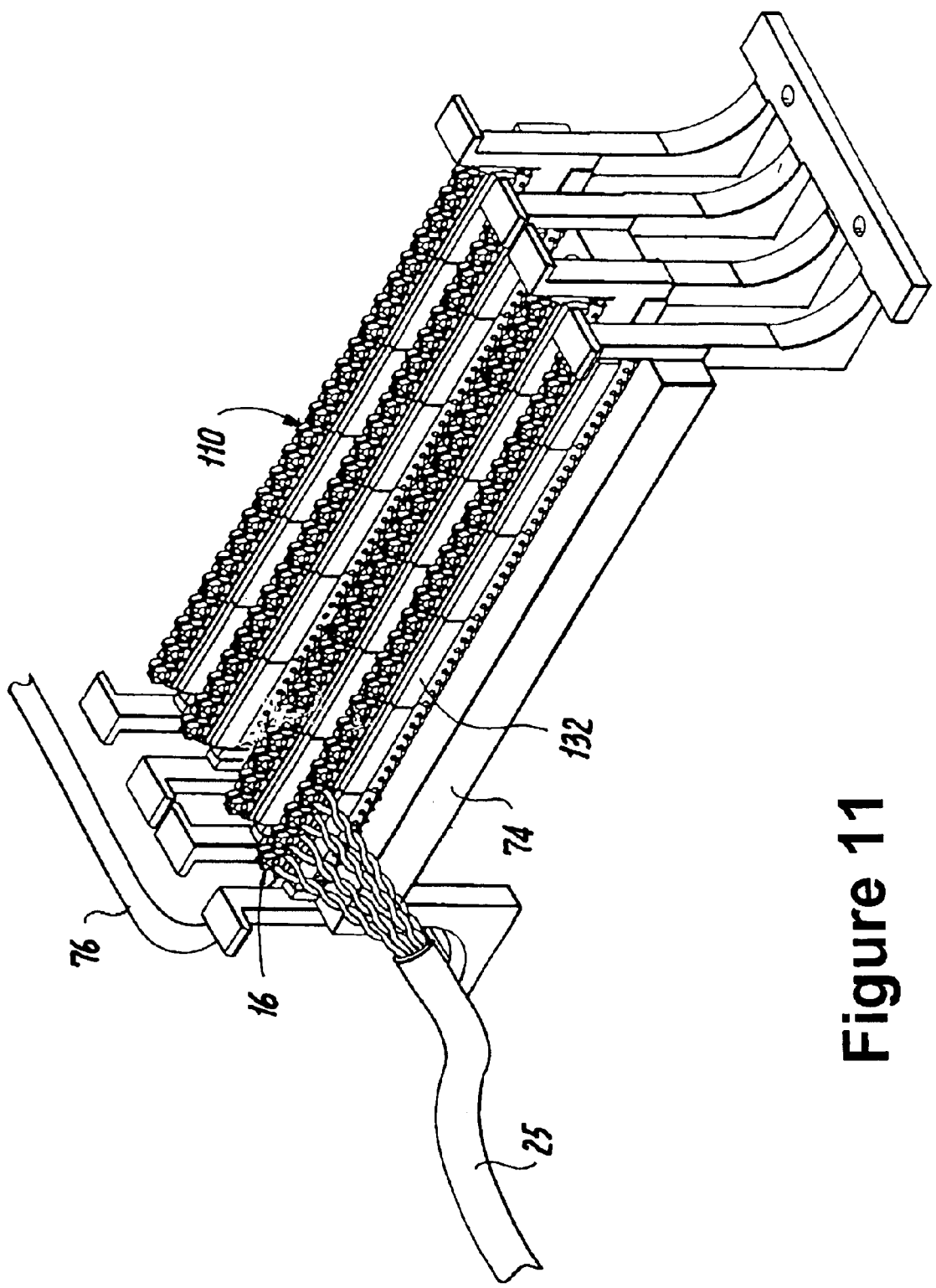
FIG. 11 is a perspective view of the manner in which multiple 110 terminal blocks constructed in accordance with the present disclosure may be connected to a interconnecting wiring panel having input and output UTP cables spliced and installed on the blocks to complete the electrical connection for an UTP media system.

FIGS. 1–3 illustrate the general configuration of a standard 110 IDC terminal block 10 currently used in the field. The IDC housing 12 is constructed of a dielectric material and generally rectangular in shape. Housing 12 has a first cable engagement portion 14, a second cable engagement portion 16, a panel engagement portion 18, lead frame engagement port 20 and eight lead frame receiving slots 22. First and second cable engagement portions 14 and 16 provide locations for the connection of two cables with block 10 on opposing sides of housing 12. Second cable engagement portion 16 is located substantially within panel engagement portion 18, which serves to further secure the cable connection with engagement portion 16, as shown in FIG. 11. The eight lead frame receiving slots 22 are accessible only through panel engagement portion 18.

Figure 4:
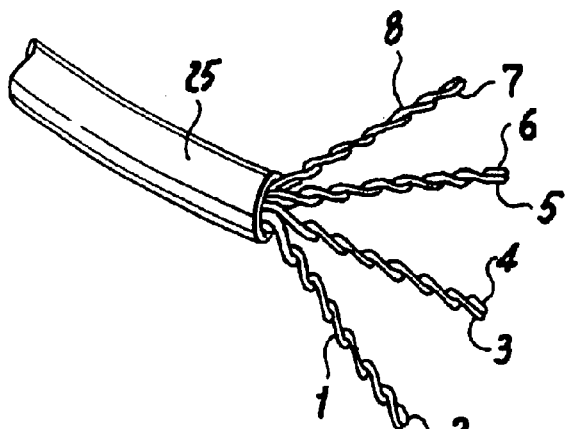
FIG. 4 is a perspective view illustrating the arrangement of wires in a standard four pair UTP cable.
Figure 5:
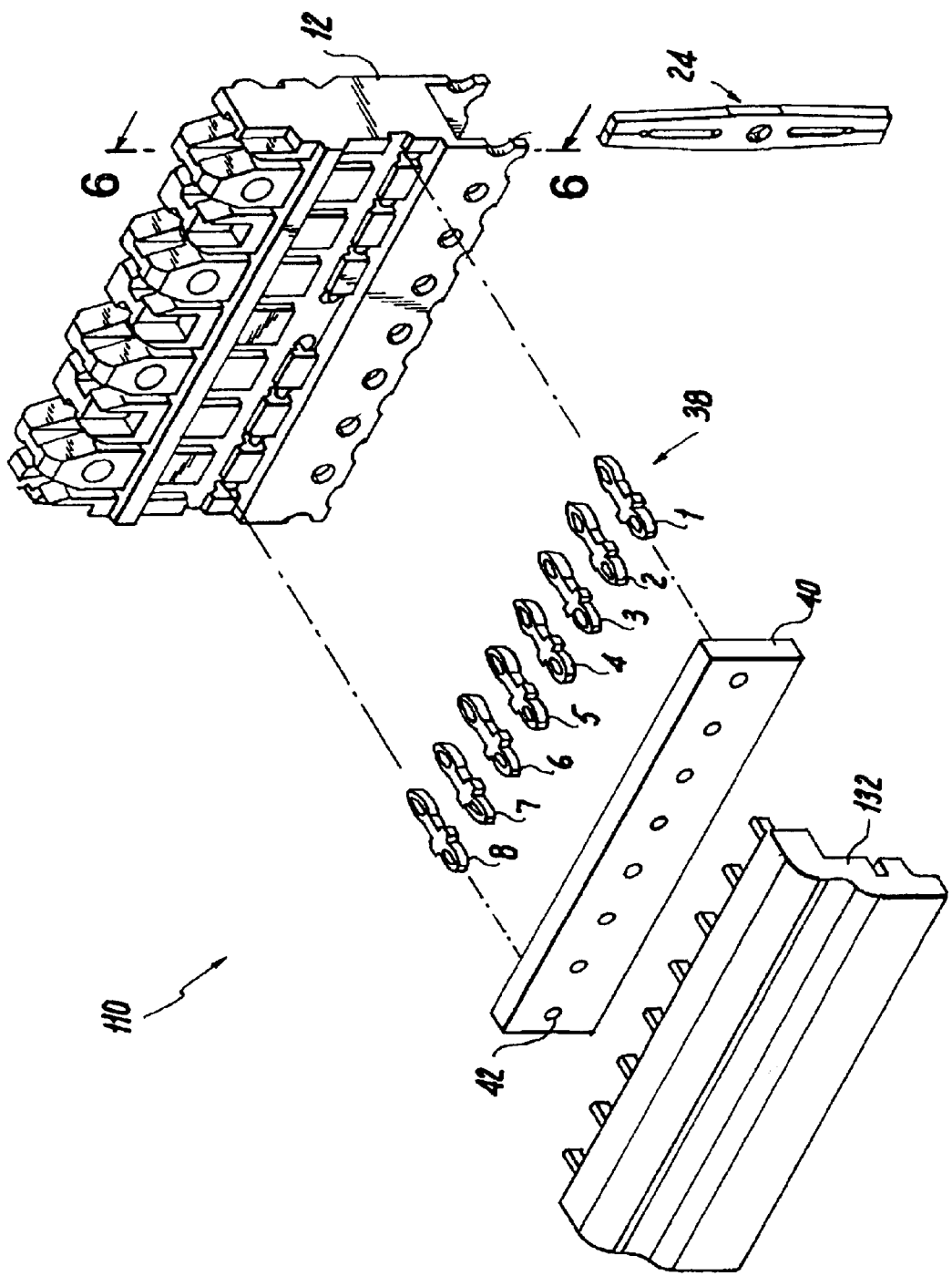
FIG. 5 is an exploded perspective view illustrating the arrangement of components in a exemplary balance high density 110 IDC terminal block constructed in accordance with the present disclosure.
Figure 7:
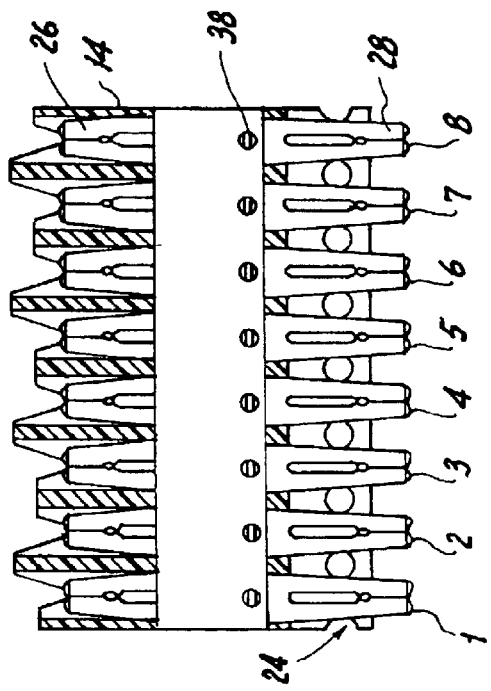
FIG. 7 is a cross-sectional view of the exemplary balance high density 110 IDC terminal block of FIG. 5 taken along line 7—7.
Figure 8:
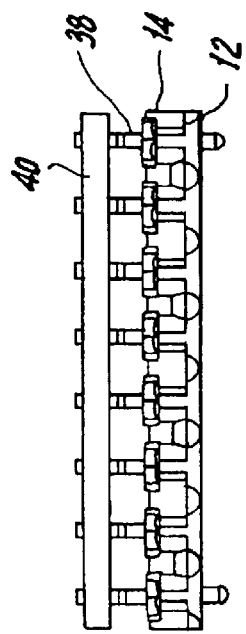
FIG. 8 is a top view of the exemplary balance high density 110 IDC terminal block of FIG. 5.
Figure 6:
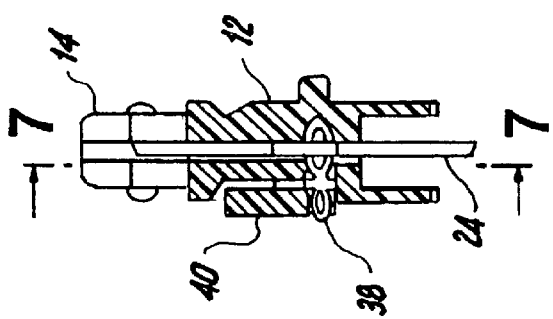
FIG. 6 is a cross-sectional view of the exemplary balance high density 110 IDC terminal block of FIG. 5 taken along line 6—6.

Block 10 typically contains four pairs of elongated lead frames 24 which are configured and arranged to accept standard UTP 22–26 gauge wires. For the EIA T568B or T568A style configurations of category 5 and 6 UTP cabling, there are eight positions from four pairs of wires as shown in FIG. 4. Lead frames 24 are constructed of an electrically conductive material are disposed in slots 22 within housing 12 to provide electrical communication between the first and second cable engagement portions 14 and 16. Each lead frame 24 has opposing first and second wire insulation cutting contact ends 26 and 28, which correspond in location with the first and second cable engagement portions 14 and 16 when lead frames 24 are secured in housing 12. Each lead frame 24 also has a hole 30 substantially adjacent to its middle portion which is adjacent the lead frame engagement port 20 upon installation in slots 22.

To assemble block 10, the lead frames 24 are inserted into receiving slots 22 within housing 12. First cable engagement portion 14 is configured to receive first contact end 26. Lead frames 24 are fully secured by a dielectric cover 32 configured to fit into lead frame engagement port 20. Cover 32 has eight pegs 34 disposed thereon which are inserted through peg receiving slots 36 in housing 12 and into holes 30 to fasten the eight lead frames 24 in position.

A significant portion, and in many instances, a majority of the coupled noise associated with the standard UTP four pair cable, such as cable 25 shown in FIG. 4, arises from the adjacency of the paired arrangements. Additional coupled noise occurs due to the parallel arrangement of contacts in data transfer and UTP cable connecting components such as the IDC. In standard four pair UTP cables (such as cable 25), pair 1 includes wires 1 and 2, pair 2 includes wires 3 and 4, pair 3 includes wires 5 and 6 and pair 4 includes wires 7 and 8. Each wire in the pairs is of a different polarity, representing the different direction of signal transmission, and are referred to as "ring" (negative voltage) and "tip" (positive voltage). Thus, in a standard UTP cable, wires 1, 3, 5 and 7 are ring while wires 2, 4, 6 and 8 are tip.

Typically, the worst case for a UTP four pair cable is wires 2 through 7 because these wires are positioned adjacent wires with both transmitting and receiving signals or two opposing polarities. On a relative basis, the worst case NEXT noise in a 110 IDC terminal block is from an imbalance of coupled negative noise, meaning the noise is coupled unequally upon the adjacent pairs which also primarily effects wires 2–7. The wires in the cable may create noise problems for other wires, but such problems are of significantly lesser magnitude because only one wire is the noise source.

Referring now to FIGS. 5–8, an exemplary high density 110 IDC terminal block 110 constructed in accordance with the present disclosure is illustrated. For purposes of describing the features of this embodiment, numbers 1–8 have been labeled on parts that would be in electrical communication with wires 1–8 upon installation of a UTP cable with the block 110.

Instead of a cover 32 securing frames 24 with pegs 34, block 110 incorporates eight pins 38 constructed of an electrically conductive material which are inserted into slots 36. Pins 38 contact and secure frames 24. Preferably, pins 38 are of the type known in the field as "dual compliant" pins which, when secured, provide a gas tight electrical connection which is comparable to direct metal soldering.

A printed circuit board ("PCB") 40 having eight receiving ports 42 is physically and electrically connected with the opposing ends of pins 38. Thus, pins 38 provide a mechanical connection and electrical communication between PCB 40 and frames 24. Preferably, and as shown, a cover 132 is placed over PCB 40 on block 110 to protect PCB 40 and pins 38. Cover 132 may be secured by any conventional means, such as a snap-fit arrangement or screws.

Figure 9:
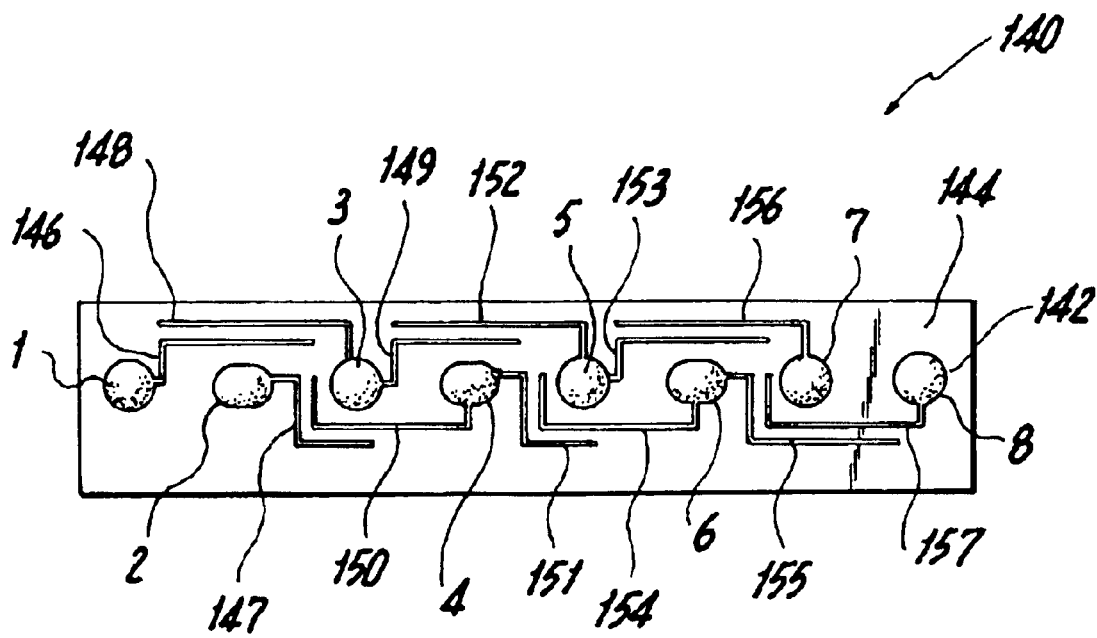
FIG. 9 is a top view of the first side of a PCB for use with an exemplary balance high density 110 IDC terminal block in accordance with the present disclosure.
Figure 10:
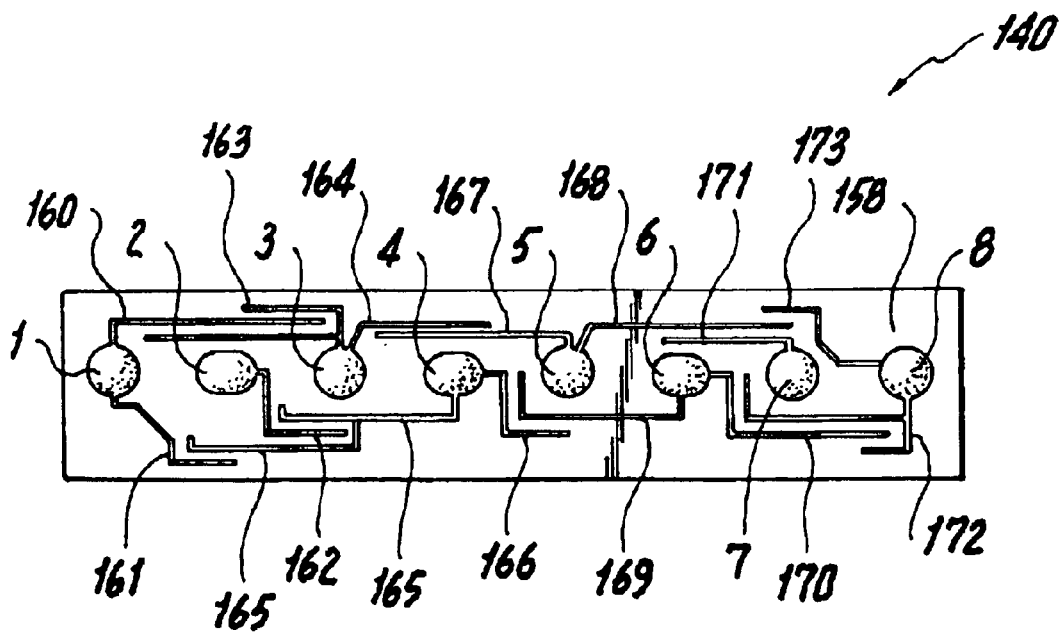
FIG. 10 is top view of the second side of the PCB for use with an exemplary balance high density 110 IDC terminal block of FIG. 9.

FIGS. 9 and 10 illustrate an exemplary embodiment of a PCB constructed in accordance with the present disclosure. Pins 38 corresponding to wires 1–8 are inserted into communication ports 142 lined with a conductive material to permit communication of signals from wires 1–8 to PCB 140.

PCB 140 incorporates a balancing capacitive bridge circuitry that adds signal feedback to the appropriate wire pairs. In differentially signal driven systems, the signals are typically equal in magnitude but have opposite polarity, that is, ring and tip as previously discussed. In a typical 110C connecting block one pair's negative wire is adjacent another pair's positive wire causing signal unbalance that increases NEXT and FEXT. In order to achieve proper circuit balance of NEXT noise vectors, the input to output victim lines can be described as a balance voltage bridge of mutual capacitor reactance. The output contains negative and positive mutual capacitance obtained from coupling with other lead frames 24. Thus, to reduce the victim lines induced crosstalk noise, the output must be re-balanced to correspond with the input. PCB 140 serves to route the signals associated with the eight wires in electrically conductive members which induces feedback coupling that will either increase or decrease the signal magnitude depending on their respective polarities to rebalance the signals.

FIG. 9 depicts a first side 144 of PCB 140 having traces 146–157 constructed of an electrically conductive material disposed thereon. FIG. 10 depicts a second side 158 of PCB 140 having traces 160–173 constructed of an electrically conductive material disposed thereon. The traces may be etched on PCB 140 or disposed by any other conventional method. Preferably, the traces are formed as elongated conductive strips of metal. The traces are in electrical communication with ports 142 to receive signals from wires 1–8. Portions of the traces are arranged in a positional relationship with respect to each other or other traces which is conducive to reducing and/or compensating for electrical noise. Preferably, the reduction and/or compensation of electrical noise is accomplished by inducing coupling between the traces to counteract the coupling which occurred while the signal passed through cable 25 and into block 110. Coupling may be induced simply by aligning the traces adjacently on PCB 140.

Preferably, each trace is of the same thickness and length, and there is an equal amount of separation between each trace, which aids in producing peak field coupling. The type of coupling may be described as forward compensation or reverse compensation. Forward compensation refers to inducing coupling between traces associated with wires carrying the same polarity signals, that is, coupling is induced between traces associated with wires having ring polarity signals and likewise with traces associated with wires having tip polarity signals. Forward compensation typically increases the magnitude of the coupled signal to reduce the unwanted electrical noise. Reverse compensation is inducing coupling between traces associated with wires having opposing signals (i.e., ring and tip), which typically helps to balance the signals from wires which were not primarily effected by two adjacent wires, such as wires 1 and 8 in a standard UTP cable. Reverse compensation also helps remove any electrical noise that originated as a result of any non-adjacent wires since all pairs have a percentage of coupled signals from each other.

Thus, on first side 144 in this embodiment, wire 1 is associated with trace 146 which is in a positional relationship to induce coupling with trace 148 associated with wire 3. Trace 147 associated with wire 2 is in a positional relationship to induce coupling with trace 150 associated with wire 4. Trace 149 associated with wire 3 is in a positional relationship to induce coupling with trace 152 associated with wire 5. Trace 151 associated with wire 4 is in a positional relationship to induce coupling with trace 154 associated with wire 6. Trace 153 associated with wire 5 is in a positional relationship to induce coupling with trace 156 associated with wire 7. Trace 155 associated with wire 6 is in a positional relationship to induce coupling with trace 157 associated with wire 8.

On second side 158 of PCB 140, trace 160 associated with wire 1 is in a positional relationship to induce coupling with trace 163 associated with wire 3. Trace 161 associated with wire 1 is in a positional relationship to induce coupling with trace 165 associated with wire 4. The coupling between traces 161 and 165 provides reverse compensation. Trace 162 associated with wire 2 is in a positional relationship to induce coupling with trace 165 associated with wire 4. Trace 164 associated with wire 3 is in a positional relationship to induce coupling with trace 167 associated with wire 5. Trace 166 associated with wire 4 is in a positional relationship to induce coupling with trace 169 associated with wire 6. Trace 168 associated with wire 5 is in a positional relationship to induce coupling with trace 171 associated with wire 7. Trace 168 is also in a positional relationship with trace 173 associated with wire 8 to provide for reverse compensation. Trace 170 associated with wire 6 is in a positional relationship to induce coupling with trace 172 associated with wire 8.

In summary, the traces in PCB 140 re-balance the wire pairs by inducing both negative and positive coupling to the adjacent pair wires. For this embodiment, in adjacent pairs 1 and 2, the signal from wire 1 (negative) is coupled with the signal from wire 3 (negative) and the signal from wire 4 (positive) is coupled with the signals from wire 1 and wire 2 (positive). In adjacent pairs 2 and 3, the signal from wire 3 is coupled with the signal from wire 5 (negative) and the signal from wire 4 is coupled with the signal from wire 6 (positive). For adjacent pairs 3 and 4, the signal from wire 6 is coupled with the signal from wire 8 (positive) and the signal from wire 5 is coupled with the signals from wire 7 (negative) and the wire 8.

The capacitance symbols from a balance bridge are as follows:
−C23 equals IDC terminal block lead frame mutual capacitance of pairs 1 and 2;
C13 equals IDC terminal block lead frame mutual capacitance of pairs 1 and 3;
C14 equals IDC terminal block lead frame mutual capacitance of pairs 1 and 4;
C24 equals IDC terminal block lead frame mutual capacitance of pairs 2 and 4;

(providing that the interfacing plugs positive mutual capacitance equals the PCB negative mutual capacitance to complete the balance circuit.)

The circuit balance between source and victim will be as shown: $|C12|$ source=$|C34|$victim. The source signal $|C12|$ induces an unwanted mutual capacitance $|C23|$. If certain assumptions and theoretical percentages of the invention for source and victim line mutual capacitance's are introduced the formula evolves into:

$|-1^{1/2}C_{23}|=|+1^{1/4}C_{13}|=-\frac{1}{4}C_{23}$ for one lead frame solving at like bridge terminals;

$|-C_{14}|=|+^{1/4}C_{24}|=\frac{1}{4}C_{14}$, for the other lead frame solving at like bridge terminals, for pair 1 being the signal source and pair 2 being the victim pair;

$|-1^{1/2}C_{23}|=|+1\frac{1}{4}C_{24}|=\frac{1}{4}C_{23}$ for one lead frame solving at like bridge terminals;

$|-C_{14}|=|-\frac{1}{2}C_{14}|^{+}|\frac{3}{4}C_{1/3}|=-\frac{1}{4}C_{14}$ for, the other lead frame solving at like bridge terminals, for pair 2 being the signal source and pair 1 being the victim pair.

Currently existing standard IDC terminal blocks typically have NEXT performance at 100 MHz of −47 dB, which fails the TIA category 6 connecting hardware specification of −54 or below. Devices constructed or existing devices modified in accordance with the present disclosure (Block 110) exceed the TIA category 6 connecting hardware specification requirements, as illustrated in the NEXT noise comparison table shown below.

TABLE

NEXT Noise Comparison

| Signal Frequency (MHz) | Category 6 Specification (−dB) | Block 110 (−dB) |
| --- | --- | --- |
| 1 | 75 | 93 |
| 10 | 74 | 83 |
| 16 | 70 | 78 |
| 20 | 68 | 77 |
| 31.25 | 64 | 73 |
| 61.5 | 58 | 65 |
| 100 | 54 | 60 |
| 155 | 50 | 57 |
| 200 | 48 | 56 |
| 250 | 46 | 54 |

As shown by the above table, a device constructed in accordance with the present disclosure, which re-balances the unwanted coupled signals of the parallel lead frame wires by utilizing a capacitive coupling PCB, provides an IDC terminal block which exceeds the EIA category 6 connecting hardware electrical specifications. The PCB as disclosed herein may also be incorporated as an insert for new or existing components. Thus, the present disclosure provides a system, device and method for reducing crosstalk noise without requiring new equipment or expensive re-wiring. An additional benefit resulting from the added capacitance is improved impedance. Impedance is typically increased by untwisting the wire pairs and the effect on the signals due to the parallel arrangement of the lead frames. The advantageous end result is an IDC terminal block that, among other things, has lower NEXT, FEXT and impedance within its wire pairs.

FIG. 11 illustrates multiple IDC terminal blocks, such as block 110, connected to an interconnecting wiring panel 74 via the panel engagement portions 18. Preferably, blocks 110 snap-fit onto a corresponding receiving portion on panel 74. Input cable 25 is connected with the first cable engagement portion 14 and output cable 76 is connected with the second cable engagement portion 16 (not shown).

The features of the preferred embodiments depicted herein are in accordance with most standard wiring formations. The TIA/EIA commercial building standards have defined category 5e and 6 electrical performance parameters for higher bandwidth (100 up to 250 MHz) systems. In category 5e and 6, the TIA/EIA wiring style is the preferred formation and is generally followed throughout the cabling industry. However, it is within the purview of this disclosure to adapt the teachings herein for use with other wiring styles, such as those having different pairing arrangements or amounts of wires.

This method and system approach provides a more laboratory controlled product than other crosstalk reduction designs, which greatly improves design time, efficiency and cost. This method and system approach also provides a way to effectively remove crosstalk in a very small amount of printed circuit board space.

Although the disclosed systems, devices and methods have been described with respect to preferred embodiments, it is apparent that modifications and changes can be made thereto without departing from the spirit and scope of the invention as defined by the appended claims.

What is claimed is:

1. A device for use in transfer of data signals between media having a plurality of electrically conductive signal carrying elements, wherein capacitive and inductive coupling due to the position of elements causes electrical noise in the signals, the device comprising:
    (a) a dielectric support member;
    (b) a means, disposed on the dielectric support member, for receiving and transmitting signals from the signal carrying elements;
    (c) a means for producing capacitance for reducing the electrical noise prior to transmitting the signals; and
    (d) means for electrically connecting the means for producing capacitance and the means for receiving and transmitting signals, wherein said means for electrically connecting includes a plurality of electrically conductive, dual compliant pins.

2. A device as recited in claim 1, wherein the means for receiving and transmitting signals comprises a plurality of electrically conductive ports wherein each electrically conductive port is in electrical communication with one signal element of the plurality of signal elements.

3. A device as recited in claim 1, wherein the means for producing a capacitance for reducing the electrical noise comprises a plurality of elongated electrically conductive members in a close positional relationship with respect to each other.

4. A device as recited in claim 3, wherein at least one of the elongated electrically conductive members is associated with each port.

5. A device as in claim 1, wherein the means for producing capacitance for reducing the electrical noise comprises a printed circuit board having a plurality of electrically conductive members disposed in a pattern thereon such that a capacitance is formed.

6. A device for reducing crosstalk noise in an insulation displacement contact assembly connectable with media having a plurality of signal carrying elements, the device comprising:
    (a) a dielectric support member;
    (b) a plurality of electrically conductive members disposed on the support member; and
    (c) a plurality of electrically conductive, dual compliant pins for electrically connecting the insulation displacement contact assembly and the plurality of electrically conductive members;
    wherein the plurality of electrically conductive members are in a positional relationship with respect to each other to produce a capacitance for reducing the crosstalk noise.

7. A device as recited in claim 6, wherein the plurality of electrically conductive members includes a plurality of elongated members and one or more of the plurality of elongated members are operatively associated with each signal carrying element.

8. A device as recited in claim 7, wherein a substantially larger amount of elongated members associated with signal carrying elements of the same polarity are in a positional relationship to produce a capacitance than elongated members associated with signal carrying elements of opposing polarities.

9. A device as recited in claim 7, wherein the elongated members associated with signal carrying elements of the same polarity are in a positional relationship with respect to each other for forming a capacitance to strengthen the signal.

10. A device as recited in claim 6, wherein the plurality of electrically conductive members includes a plurality of elongated members that are all substantially the same size and distance from each other.

11. A device as recited in claim 6, wherein the media is unshielded twisted pair cable having eight signal carrying elements.

12. A system for use in transfer of data signals between media cables having signal carrying elements, the system comprising:
    (a) an insulation displacement contact assembly having a first dielectric support member and a plurality of electrically conductive members disposed thereon, wherein each of the plurality of electrically conductive members have first and second wire insulation cutting contacts for connecting with respective signal carrying elements of the signal carrying elements associated with the media cables; and
    (b) a printed circuit board having a second dielectric support member and electrically conductive traces disposed thereon being connectable with the electrically conductive members, wherein the traces have portions in positional relationships with respect to each other for forming reactance between the electrically conductive members to reduce electrical noise introduced by the transfer of data signal between media cables.

13. A system as recited in claim 12, wherein the electrically conductive members associated with signal carrying elements of similar polarity are in a positional relationship with respect to each other for forming a capacitance to strengthen the respective signal.

14. A system as recited in claim 12, wherein there are eight conductive members.

15. A system as recited in claim 14, wherein there are eight communication ports on the printed circuit board in electrical communication with the eight conductive members.

16. A system as recited in claim 15, wherein each communication port is associated with at least one trace disposed on the printed circuit board.

17. A system as recited in claim 16, further comprising:
    (a) traces in communication with port three in a positional relationship with traces in communication with port one and port five, wherein the relationship is sufficient for forming a capacitance to reduce electrical noise in the associated signals;

(b) traces in communication with port seven in a positional relationship with traces in communication with port eight and port five, wherein the relationship is sufficient for forming a capacitance to reduce electrical noise in the associated signals;

(c) traces in communication with port six in a positional relationship with traces in communication with port four and port eight, wherein the relationship is sufficient for forming a capacitance to reduce electrical noise in the associated signals; and (d) traces in communication with port four in a positional relationship with traces in communication with port one and port two, wherein the relationship is sufficient for forming a capacitance to reduce electrical noise in the associated signals.

18. A system as recited in claim 12, wherein the positional relationships form a balanced voltage bridge of mutual capacitor reactance for compensating the electrical noise.

19. The device of claim 1 wherein the plurality of electrically conductive, dual compliant pins electrically connects the means for receiving and transmitting signals and the means for reducing the electrical noise.

20. The device of claim 6 wherein the plurality of electrically conductive members comprises a plurality of elongated electrically conductive members that are in positional relationship with each other to produce capacitance for reducing the crosstalk noise.

21. The device of claim 6 wherein the insulation displacement contact assembly includes a plurality of insulation displacement contacts and each of the plurality of electrically conductive, dual compliant pins provides electrical communication between a respective contact and a respective electrically conductive member.

22. The system of claim 12 wherein each of the plurality of electrically conductive members comprises a lead frame having opposing first and second wire insulation cutting contact ends.

23. The system of claim 12 wherein the electrically conductive traces disposed on the printed circuit board are electrically connected to the plurality of electrically conductive members.

24. The system of claim 23 further comprising a plurality of electrically conductive pins for electrically connecting the electrically conductive traces disposed on the printed circuit board to the plurality of electrically conductive members.

25. The system of claim 24 wherein each of the plurality of electrically conductive members comprises a lead frame that defines an opening to receive a respective one of the plurality of electrically conductive pins.

26. The system of claim 25 wherein the opening is disposed between the first and wire insulation cutting contacts.

27. The system of claim 24 wherein the printed circuit board defines a plurality of receiving ports for receiving the plurality of electrically conductive pins.

28. The system of claim 24 wherein an electrically conductive pin of the plurality of electrically conductive pin has first and second opposing ends, the first end being received by an opening of a respective one of the lead frames, the second end being received by a respective one of the receiving ports defined by the printed circuit board.

29. The system of claim 24 wherein each of the plurality of electrically conductive members is in electrically connected to only one of the plurality of electrically conductive traces on the printed circuit board.

30. The system of claim 12 further comprising a dielectric housing, said plurality of electrically conductive members being disposed in said dielectric housing.

31. A system for transfer of data signals between media cables having signal carrying elements, the system comprising:

(a) a contact assembly having a first plurality of electrically conductive members each having a first engagement portion for connecting with a first respective signal carrying element of the signal carrying elements, a second engagement portion for connecting with a second respective signal carrying element of the signal carrying elements associated with the media cables, and a connection portion for electrically connecting the first engagement portion and the second engagement portion; and (b) a printed circuit board including a second plurality of electrically conductive members that are electrically connected to the first plurality of electrically conductive members by way of the connection portions and form reactance between the first plurality of electrically conductive members to reduce electrical noise introduced by the transfer of data signal between media cables.

32. The system of claim 31, wherein the second plurality of electrically conductive members have portions in positional relationship with respect to each other for forming a capacitance to reduce said electrical noise.

33. The system of claim 31, wherein each of the second plurality of electrically conductive members is connected to the connection portion of a respective one of the first plurality of electrically conductive members.

34. The system of claim 31 wherein the first and second engagement portions each comprise a wire insulation cutting contact.

35. The system of claim 31 wherein each of the first plurality of electrically conductive members comprises a lead frame having opposing first and second wire insulation cutting contact ends.

36. The system of claim 35, further comprising a plurality of electrically conductive pins for electrically connecting the second plurality of electrically conductive members to the connection portions of the first plurality of electrically conductive members.

37. The system of claim 36 wherein each of the first plurality of electrically conductive members comprises a lead frame that defines an opening to receive a respective one of the plurality of electrically conductive pins.

38. The system of claim 37 wherein the opening is disposed substantially adjacent to a middle portion of the electrically conductive member.

39. The system of claim 36 wherein the printed circuit board defines a plurality of receiving ports for receiving the plurality of electrically conductive pins.

40. The system of claim 36 wherein an electrically conductive pin of the plurality of electrically conductive pin has first and second opposing ends, the first end being received by an opening of a respective one of the lead frames, the second end being received by a respective one of the receiving ports defined by the printed circuit board.

41. The system of claim 31 further comprising a dielectric housing, said plurality of electrically conductive members being disposed in said dielectric housing.

42. A system for transfer of data signals between media cables having signal carrying elements, the system comprising:

(a) a contact assembly having a first plurality of electrically conductive members each having a first engagement portion for connecting with a first respective signal carrying element of the signal carrying elements, a second engagement portion for connecting with a second respective signal carrying element of the signal carrying elements associated with the media cables, and a connection portion for electrically connecting the first engagement portion and the second engagement portion; and (b) a printed circuit board including a second plurality of electrically conductive members that are electrically connected to the first plurality of electrically conductive members by way of the connection portions and form reactance between the first plurality of electrically conductive members to compensate for electrical noise introduced by the contact assembly.

43. A system for transfer of data signals between media cables having signal carrying elements, the system comprising:

(a) a contact assembly having a first plurality of electrically conductive members each having a first engagement portion for connecting with a first respective signal carrying element of the signal carrying elements, a second engagement portion for connecting with a second respective signal carrying element of the signal carrying elements associated with the media cables, and a connection portion for electrically connecting the first engagement portion and the second engagement portion; and (b) a printed circuit board including a second plurality of electrically conductive members that are electrically connected to the first plurality of electrically conductive members by way of the connection portions and form reactance between the first plurality of electrically conductive members for use in compensating for noise introduced by the contact assembly.

44. A system for reducing electrical noise during the transfer of data signals between media cables having signal carrying elements of negative and positive polarity, the system comprising:

(a) an insulation displacement contact having a dielectric housing and a plurality of electrically conductive members disposed therein, wherein the electrically conductive members have engagement portions for connecting with the signal carrying elements associated with the media cables; and (b) a printed circuit board having electrically conductive traces disposed thereon being connectable with the electrically conductive members, wherein the traces have portions in positional relationships with respect to each other for forming a capacitance, wherein there are eight conductive members, there are eight communication ports on the printed circuit board in electrical communication with the eight conductive members, each communication port is associated with at least one trace disposed on the printed circuit board;

(c) traces in communication with port three in a positional relationship with traces in communication with port one and port five, wherein the relationship is sufficient for forming a capacitance to reduce electrical noise in the associated signals;

(d) traces in communication with port seven in a positional relationship with traces in communication with port eight and port five, wherein the relationship is sufficient for forming a capacitance to reduce electrical noise in the associated signals;

(e) traces in communication with port six in a positional relationship with traces in communication with port four and port eight, wherein the relationship is sufficient for forming a capacitance to reduce electrical noise in the associated signals; and (f) traces in communication with port four in a positional relationship with traces in communication with port one and port two, wherein the relationship is sufficient for forming a capacitance to reduce electrical noise in the associated signals.

* * * * *